United States Patent [19]
Sakai et al.

[11] Patent Number: 5,185,040
[45] Date of Patent: Feb. 9, 1993

[54] APPARATUS FOR FORMING ELECTRODE ON ELECTRONIC COMPONENT

[75] Inventors: Norio Sakai; Kenji Minowa; Shinji Morihiro, all of Kyoto, Japan

[73] Assignee: Murata Manufacturing Co., Ltd., Japan

[21] Appl. No.: 792,941

[22] Filed: Nov. 15, 1991

Related U.S. Application Data

[62] Division of Ser. No. 452,755, Dec. 19, 1989, Pat. No. 5,091,212.

[30] Foreign Application Priority Data

Dec. 19, 1988 [JP] Japan .................... 63-321629

[51] Int. Cl.⁵ ........................................ B05C 5/02
[52] U.S. Cl. .................... 118/406; 118/410; 118/421; 118/429; 425/811; 427/282
[58] Field of Search .......... 118/410, 429, 74, 213, 118/406, 421; 228/33, 39; 427/282; 425/811

[56] References Cited

U.S. PATENT DOCUMENTS

| | | | |
|---|---|---|---|
| 2,344,589 | 3/1944 | Bogner | 228/33 |
| 2,771,049 | 11/1956 | Fish | 228/33 |
| 2,964,007 | 12/1960 | Buffington | 118/406 |
| 3,731,866 | 5/1973 | Mason et al. | 228/33 X |
| 4,555,054 | 11/1985 | Winter et al. | 118/410 X |

*Primary Examiner*—Michael G. Wityshyn
*Attorney, Agent, or Firm*—Ostrolenk, Faber, Gerb & Soffen

[57] ABSTRACT

Disclosed herein is a method of forming strip-shaped electrodes over an end surface of a plate-shaped electronic component and two major surfaces which are in series with the end surface. A slit plate, which is provided with through slits having widths corresponding to the width of electrodes to be formed, is located above an electrode paste bath while an electronic component is arranged above the slit plate so that its end surface extends across the through slits. Before or after this step, the electrode paste is made to swell to a constant level beyond the upper surface of the slit plate, thereby applying the electrode paste to the end surface of the electronic component and the two major surfaces which are in series with the end surface in the form of strips.

13 Claims, 7 Drawing Sheets

FIG. 13 PRIOR ART
FIG. 14 PRIOR ART
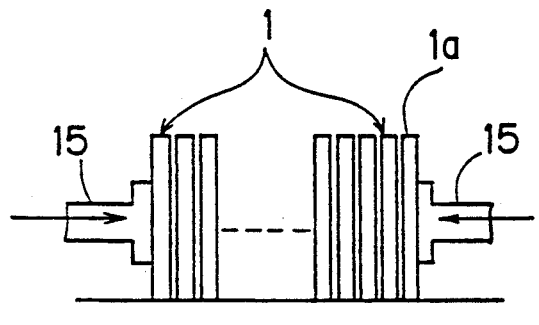
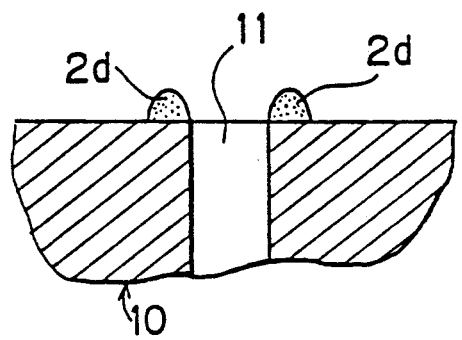
FIG. 15 PRIOR ART
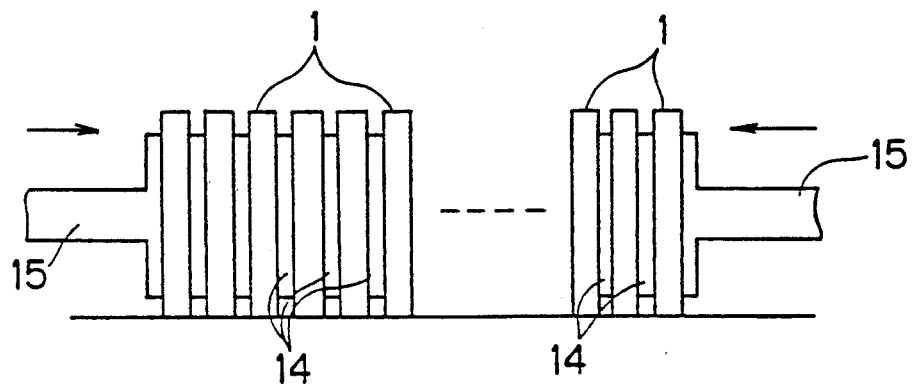
FIG. 16 PRIOR ART
FIG. 17 PRIOR ART
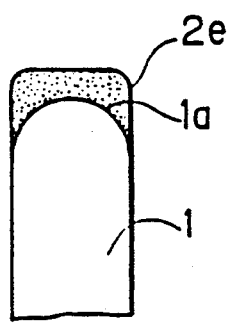
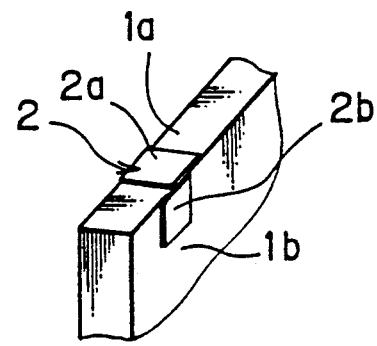

APPARATUS FOR FORMING ELECTRODE ON ELECTRONIC COMPONENT

This is a division of application Ser. No. 07/452,755, filed Dec. 19, 1989, now U.S. Pat. No. 5,091,212.

BACKGROUND OF THE INVENTION

1. Field of the Invention

The present invention relates to a method and an apparatus for forming an electrode on a part of an end surface, for example, of an electronic component with electrode paste, and more particularly, it relates to a method and an apparatus for applying electrode paste to a portion of an electronic component to be provided with an electrode.

2. Description of the Background Art

Referring to FIG. 9, electrodes 2 are formed on prescribed outer surface regions of an electronic component 1. Each electrode 2 serially extends over an end surface 1a of the electronic component 1 and respective ones of an opposite pair of major surfaces 1b and 1c, which are in series with the end surface 1a through opposite edges of the end surface 1a. Thus, the electrode 2 has a U-shaped section as a whole, and comprises an electrode part 2a which is positioned on the end surface 1a and electrode parts 2b and 2c which are positioned on the major surfaces 1b and 1c respectively.

In general, such electrodes 2 are typically formed by one of the following two methods employing screen printing:

FIG. 10 shows the first method, in which electronic components 1 are received in cavities 11, which are provided in a holder 10, so that upper end surfaces 1a thereof upwardly project from the cavities 11. Screen printing is performed from above the projecting upper end surfaces 1a to form electrode parts 2a. Then, another holder 12 having cavities 13 is prepared as shown in Fig. 11, to receive the electronic components 1 in the cavities 13 in a sidelong manner as shown in FIG. 12. In this state, screen printing is performed on first major surfaces 1b of the electronic components 1, which are in series with the end surfaces 1a, to form electrode parts 2b. Then, the electronic components 1 are so turned over in the cavities 13 as to upwardly direct second major surfaces 1c, and screen printing is performed to form electrode parts 2c.

FIG. 13 shows the second method, in which electronic components 1 are upwardly arranged between a pair of clamp members 15. Similarly to the first method, screen printing is performed on end surfaces 1a of the electronic components 1 to form electrode parts 2a. Then the aforementioned holder 12 is employed to separately perform screen printing on major surfaces 1b and 1c of the electronic components 1, thereby forming electrode parts 2b and 2c respectively.

In the first and second methods, the electrode parts 2a are formed by screen printing in different manners, while the electrode parts 2b and 2c are formed in the same step.

According to the first method, however, as shown in FIG. 14, parts of electrode paste 2d may be adhered to upper edge portions of a pair of walls defining each cavity 11 during screen printing of each electrode part 2a. Such electrode paste 2d may enter the cavity 11 through a clearance defined around the electronic component 1 which is received therein, to stain the electronic component 1. Further, a screen employed for screen printing is pressed by irregular surfaces of the electronic components 1 projecting from the upper openings of the cavities 11 as shown in FIG. 10, and hence the screen is expanded or damaged.

In the second method, on the other hand, electrode paste may cause a capillary phenomenon to enter clearances between the electronic components 1, which are arranged in close contact with each other so that the end surfaces 1a thereof are subjected to screen printing. Thus, the electronic components 1 may be stained by the electrode paste. In order to prevent this, it is necessary to interpose spacers 14 of paper or the like between the electronic components 1, as shown in FIG. 15. However, it takes time to interpose the spacers 14 between the electronic components 1. Also in the second method, the screen for printing is expanded or damaged similarly to the first method.

In addition, the first and second methods commonly have the following disadvantages:

If an end surface 1a of an electronic component 1 to be screen-printed is rounded as shown in FIG. 16, printed electrode paste 2e is irregularized in thickness over the center and end portions along the direction of thickness of the electronic component 1.

Further, the electrode parts 2a, 2b and 2c of the electrodes 2 must be formed in different steps respectively. In order to carry out these steps, it is necessary to transfer the electronic components 1 from the holder 10 or the clamp member 15 to the holder 12 and to turn over the same within the holder 12, while drying steps are required after the steps of printing the electrode parts 2a, 2b and 2c respectively. Thus, the operation for printing the electrodes 2 is extremely inefficient.

Each electrode 2 is formed by separately printing the three electrode parts 2a, 2b and 2c, and hence the electrode part 2a may deviate from the electrode part 2b and/or the electrode part 2c (not shown), as shown in Fig. 17. Such deviation will be further promoted if the screen is expanded or damaged as hereinabove described, for example. The screen may be also expanded or damaged when the same is used over a long period of time.

The electrode paste is exposed to the outside air during the screen printing steps. Thus, viscosity of the paste may be undesirably changed by evaporation of a solvent contained therein. Such change in viscosity of the paste results in change in thickness of a printed paste film. Thus, the printed paste film may be changed in thickness with time during screen printing.

SUMMARY OF THE INVENTION

Accordingly, an object of the present invention is to provide a method and an apparatus for forming an electrode on an electronic component, which can solve the aforementioned problems caused by screen printing.

In the inventive method of forming electrodes on an electronic component, first prepared are a slit plate which is provided with a through slit having width corresponding to the width of an electrode to be formed, and a bath of electrode paste for forming an electrode. The slit plate is located above the electrode paste bath. An electronic component is arranged above the slit plate so that a surface of the electronic component to be provided with an electrode extends across the through slit. Before or after this step, the electrode paste bath is brought to a level reaching the surface to be provided with an electrode through the through slit. Thus, the electrode paste passes through the through slit and is applied to the surface to be provided with an electrode.

In the step of bringing the electrode paste bath to a level reaching the surface to be provided with an electrode, the electrode paste may be made to partially upwardly swell beyond the upper surface of the slit plate, so that an electrode can be simultaneously formed to extend over an end surface of the electronic component as well as opposite major surfaces which are in series with the end surface.

The inventive method is preferably carried out with an apparatus having the following structure: This apparatus comprises a container having an opening upper surface for storing electrode paste for forming an electrode. The aforementioned slit plate is arranged to close the upper surface of the container. This apparatus further comprises means for providing pressure condition causing such pressure difference that the pressure within the container is higher than that in the exterior of the container, thereby raising up the electrode paste in the through slit.

According to the present invention, the electrode paste is brought to a level reaching the surface to be provided with an electrode through the through slit, to be adhered to the electronic component. Thus, it is possible to simultaneously form an electrode on the end surface of the electronic component and the two major surfaces which are in series with the end surface by making the electrode paste swell beyond the upper surface of the slit plate, if necessary. Further, it is also possible to form an electrode substantially in uniform thickness even if the end surface of the electronic component is rounded.

According to the present invention, the problems caused by expansion or damage of the screen for screen printing can be solved since no screen printing is employed. Thus, the electrode can be formed in high dimensional accuracy. For example, it is possible to form electrodes which are narrower than those formed by screen printing, by reducing the width of the through slit and increasing viscosity of the electrode paste.

It is possible to substantially seal the electrode paste by storing the electrode paste in a container and arranging the slit plate to close an opening of the container. Thus, the electrode paste can be prevented from time change of viscosity since a solvent etc. contained therein hardly evaporates. Consequently, it is possible to reduce time change in thickness of the electrode paste.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a front elevational view showing a step carried out in a second conventional method of forming electrodes;

FIG. 14 is an enlarged sectional view showing a part of the holder shown in FIG. 10, for illustrating a problem caused in the first conventional method;

FIG. 15 is a front elevational view for illustrating a method which is employable for solving a problem caused in the second conventional method;

FIG. 16 is an enlarged sectional view showing a part of an electronic component for illustrating a problem commonly caused in the first and second conventional methods; and FIG. 17 is a perspective view showing a part of an electronic component for illustrating another problem commonly caused in the first and second conventional methods.

DESCRIPTION OF THE PREFERRED EMBODIMENTS

Figure 1:
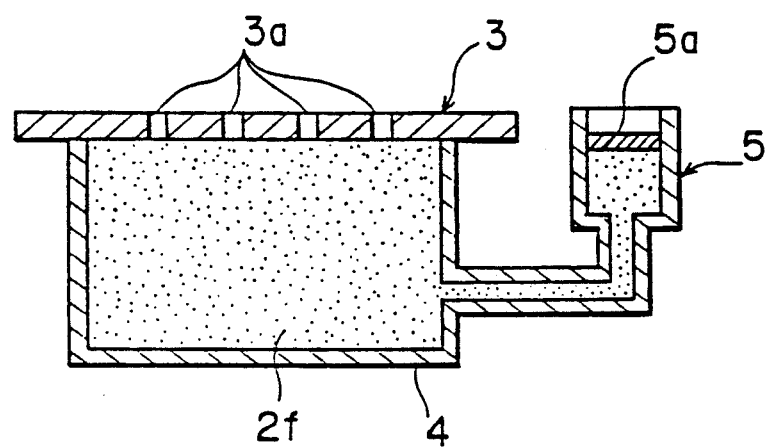
FIG. 1 is a longitudinal sectional view showing an electrode forming apparatus according to an embodiment of the present invention.

FIG. 1 shows an electrode forming apparatus according to an embodiment of the present invention.

This apparatus comprises a slit plate 3 having through slits 3a which are provided in prescribed width at regular intervals in correspondence to the number and positions of electrodes to be formed on electronic components, a container 4 storing electrode paste 2f so that the slit plate 3 is placed thereon, and pressure means 5 provided on the lateral side of the container 4. A presser plate 5a, which is provided on the pressure means 5, is pushed down to press the electrode paste 2f, thereby extruding parts of the electrode paste 2f through the through slits 3a. The junction between the slit plate 3 and the container 4 is so sealed as to prevent leakage of the electrode paste 2f.

Figure 2:
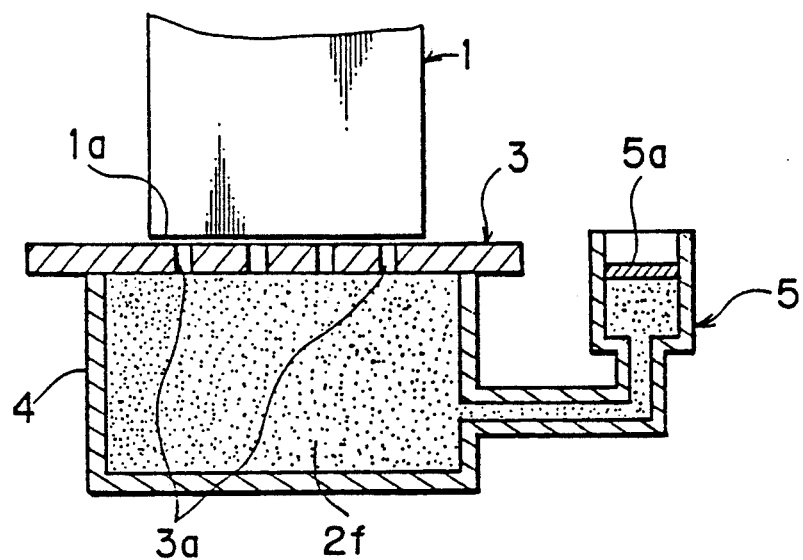
FIGS. 2, 3 and 4 show steps carried out for forming electrodes through the electrode forming apparatus shown in FIG. 1.

When a prescribed preparation step of bringing the electrode paste 2f to a prescribed temperature or the like is completed, an electronic component 1 is upwardly held by a holding member (not shown) or the like and placed on the slit plate 3 so that an end surface 1a of the electronic component 1 to be provided with electrodes extends across the through slits 3a, as shown in FIG. 2. The slit plate 3 and the electronic component 1 may define a clearance therebetween, or may be in contact with each other.

Figure 3:
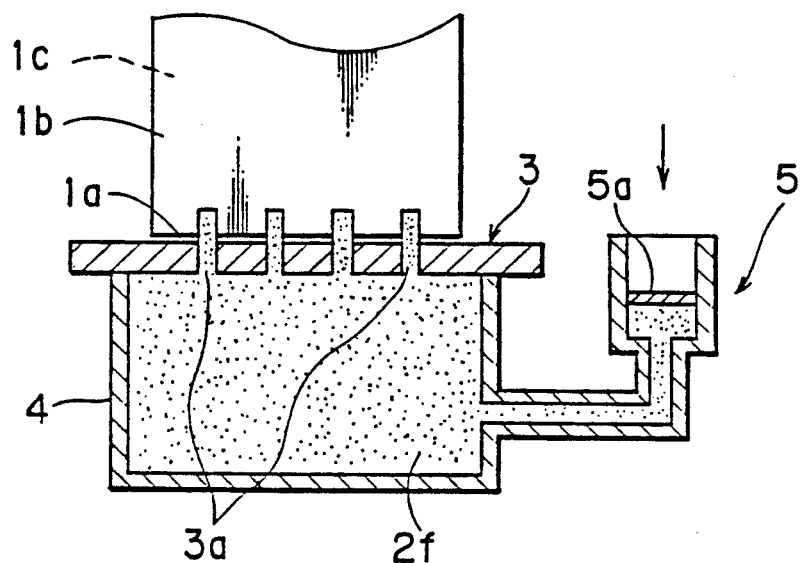

Then the pressure means 5 is driven to extrude a desired volume of the electrode paste 2f from the through slits 3a provided in the slit plate 3, as shown in FIG. 3. Thus, parts of the electrode paste 2f swell from the slit plate 3, to be adhered to the end surface 1a of the electronic component 1 and two major surfaces 1b and 1c which are in series with the end surface 1a.

Figure 4:
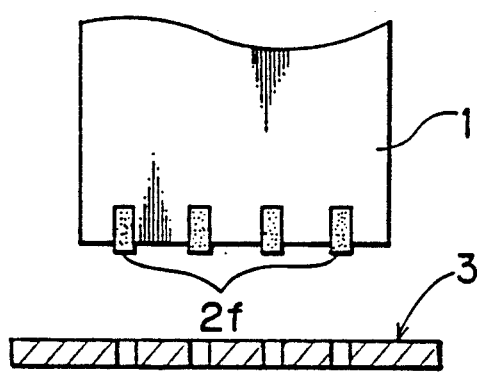
Figure 5:
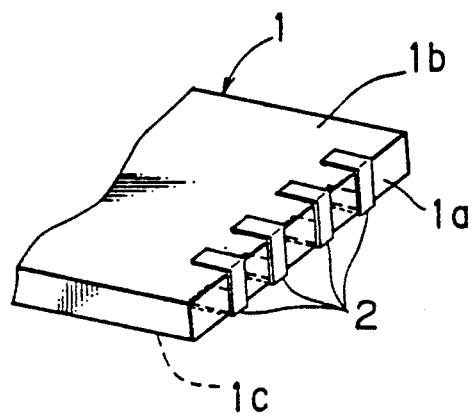
FIG. 5 is a perspective view showing a part of an electronic component 1 which is provided with electrodes through the steps shown in FIGS. 2, 3 and 4.

Thereafter parts of the electrode paste 2f left on the slit plate 3 are returned to the container 4, and the electronic component 1 is lifted up as shown in FIG. 4. Thus, strip-shaped electrodes 2 having U-shaped sections are simultaneously formed on the electronic component 1 in a single electrode forming process over the end surface 1a and the major surfaces 1b and 1c, as shown in FIG. 5. The electronic component 1 may be lifted up before the parts of the electrode paste 2f are returned to the container 4.

Figure 6:
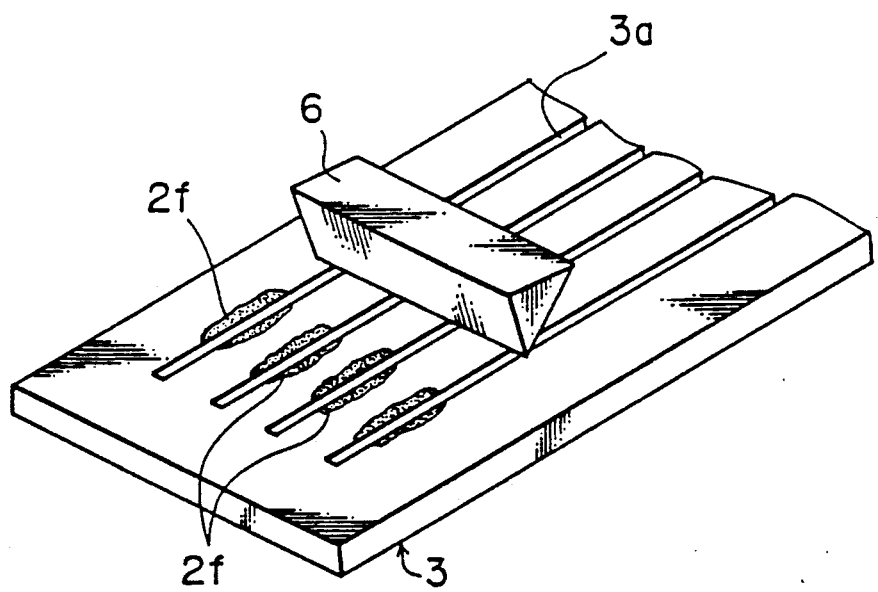
FIG. 6 is a perspective view showing a step of scraping off parts of electrode paste remaining on the upper surface of a slit plate.

Then, parts of the electrode paste 2f adhered to the upper surface of the slit plate 3 are scraped off with a scraper 6 which is in the form of a triangle pole, for example, as shown in FIG. 6. This step is not necessary if no electrode paste 2f is adhered to the upper surface of the slit plate 3. It is noted that parts of the electrode paste 2f remaining in the through slits 3a will not stain the electronic component 1.

Thereafter the above electrode forming process is performed on a next electronic component.

Although the electronic component 1 is first placed on the slit plate 3 and the electrode paste 2f is thereafter extruded on the slit plate 3 in this embodiment, it is also possible to first upwardly extrude the electrode paste 2f to a constant level from the slit plate 3 and thereafter place the electronic component 1 on the slit plate 3, thereby forming the electrodes 2.

Figure 7:
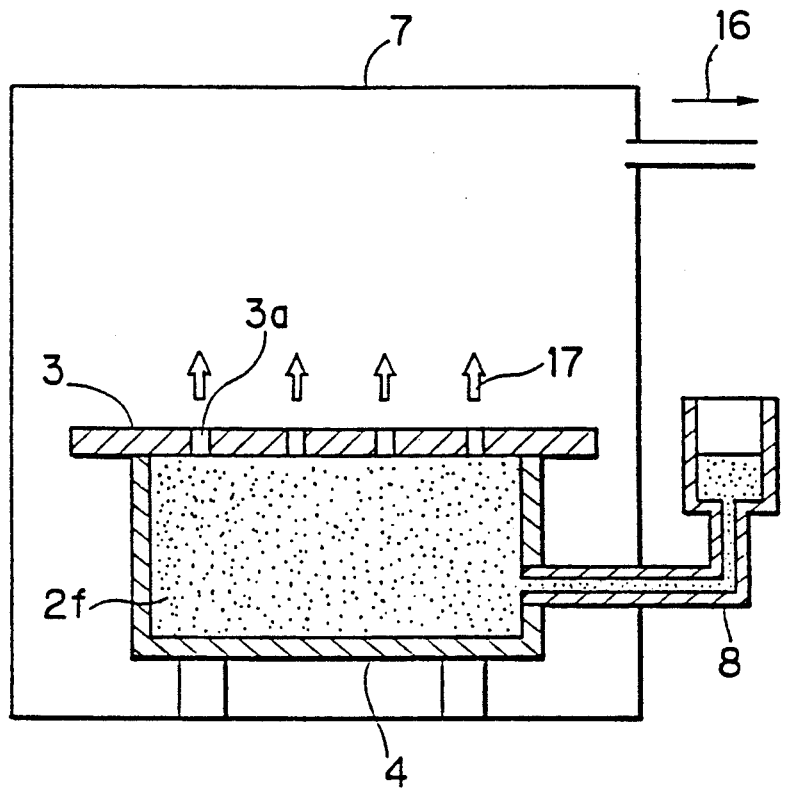
FIG. 7 is a longitudinal sectional view showing an electrode forming apparatus according to another embodiment of the present invention.

While the pressure means 5 is provided on the lateral side of the container 4 to upwardly extrude the electrode paste 2f from the slit plate 3 in the above embodiment, the present invention is not restricted to this. For example, the container 4 may be introduced into a vacuum chamber 7 as shown in FIG. 7 to couple the side surface of the container 4 with a pipe 8 which has an end provided on the exterior of the chamber 7 and decompress the interior of the chamber 7 through vacuum suction by a vacuum pump (not shown) or the like as shown by an arrow 16, thereby sucking up the electrode paste 2f through the slit plate 3 as shown by arrows 17.

Figure 8:
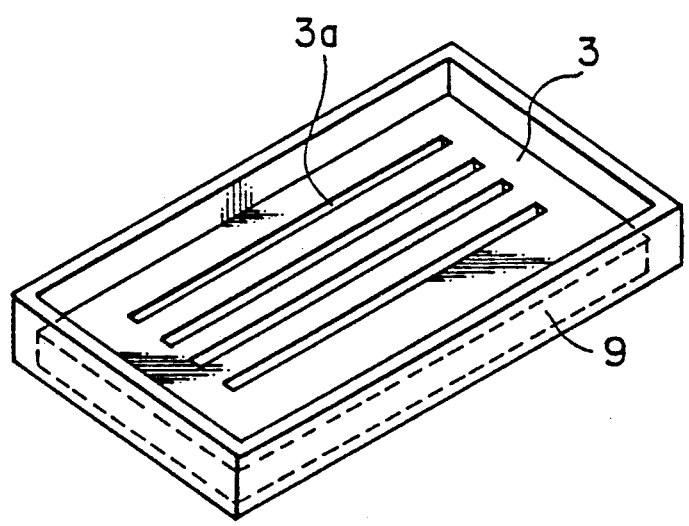
FIG. 8 is a sectional view showing the structure of a slit plate employed in still another embodiment of the present invention.
Figure 9:
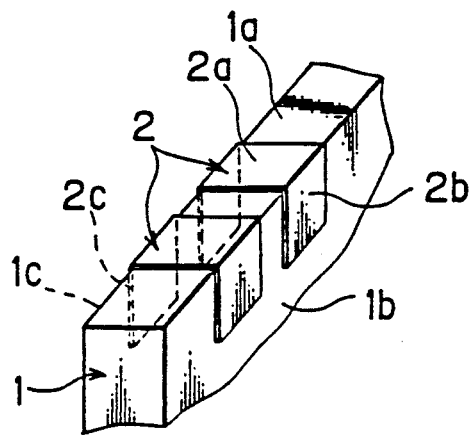
FIG. 9 is a perspective view showing a part of an electronic component which is formed with electrodes by a conventional method.
Figure 10:
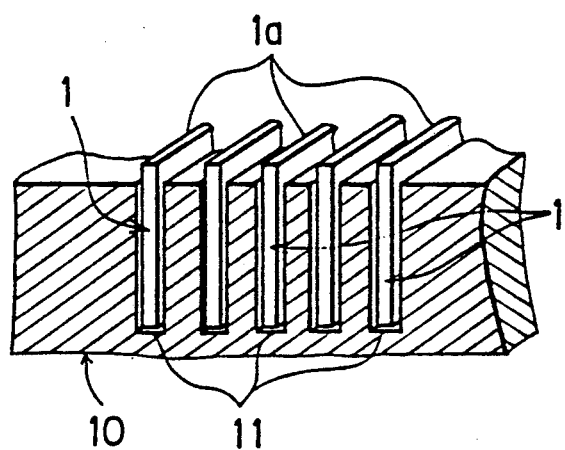
FIG. 10 is a perspective view showing a holder employed in a first conventional method of forming electrodes and electronic components held by the holder.
Figure 11:
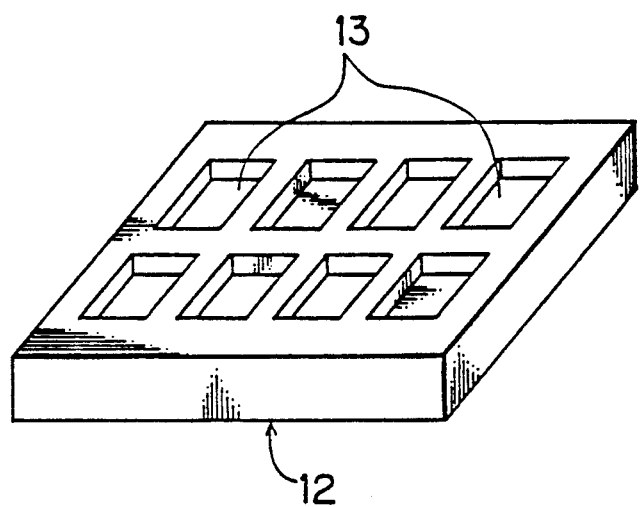
FIG. 11 is a perspective view showing another holder employed in a step carried out after the step shown in FIG. 10.
Figure 12:
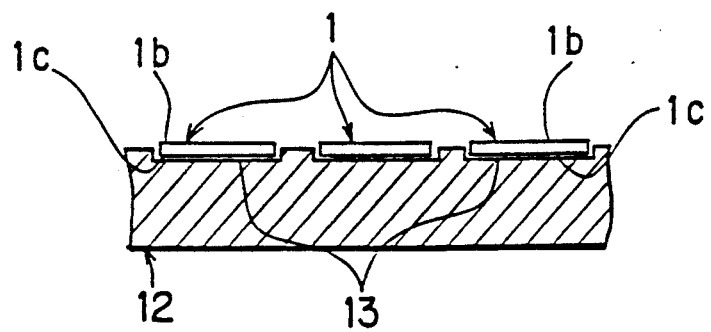
FIG. 12 is a sectional view of the holder shown in FIG. 11, with electronic components being received in cavities.

Alternatively, it is also possible to mount side plates 9 around the slit plate 3 to provide upper ends which extend beyond the upper surface of the slit plate 3 as shown in FIG. 8, and submerge the slit plate 3 in an electrode paste bath within such a range that the level of the electrode paste bath is not higher than the upper ends of the side plates 9. Then the electrode paste is made to swell to a constant level from the through slits 3a, thereby forming electrodes on an electronic component.

Although the electronic component 1 is directly placed on the slit plate 3 in the aforementioned embodiment, the present invention is not restricted to this. For example, an elastic sheet may be adhered to the upper surface of the slit plate 3, to improve contact of the slit plate 3 with the electronic component 1. Thus, it is possible to suppress spreading of the electrode paste which is adhered to the electronic component during application, thereby preventing the slit plate 3 from staining.

According to the present invention, a large number of electronic components 1 may be arranged on the slit plate 3 to form electrodes, in order to enable multiple processing.

In the aforementioned embodiment, the electronic component 1 has a flat end surface 1a and an opposite pair of major surfaces 1b and 1c which are in series with the end surface 1a through opposite edges of the end surface 1a, while the electrodes 2 are formed to extend over the first and second edges of the end surface 1a toward parts of the major surfaces 1b and 1c, as shown in FIG. 5. However, the present invention is also applicable to the case of forming electrodes only on the end surface 1a, as well as the case of forming electrodes on the end surface 1a and one of the major surfaces 1b and 1c.

Further, the present invention can also be applied to the case of forming electrodes on the rounded end surface 1a of the electronic component 1 as shown in FIG. 16, for example.

Although the present invention has been described and illustrated in detail, it is clearly understood that the same is by way of illustration and example only and is not to be taken by way of limitation, the scope of the present invention being limited only by the terms of the appended claims.

What is claimed is:

1. An apparatus for forming an electrode having a given shape on an electronic component, comprising:
   a container having an upper opening and providing a reservoir for storing electrode paste for forming an electrode having a given shape on an electronic component;
   a slit plate provided with a through slit, said through slit having a shape corresponding to the given shape of the electrode to be formed, said slit plate being arranged to cover said upper opening of said container;
   means for supplying electrode paste to said container through an inlet at a portion of said container away from said upper opening;
   means for causing the pressure in the interior of said container to be higher than the pressure outside said container, thereby causing electrode paste to rise up through said through slit and out of said container causing electrode paste to be formed into an extruded paste body corresponding in shape to the given shape of the electrode to be formed; and
   means for arranging an electronic component above said slit plate and extending across said through slit, thereby causing said extruded paste body to form an electrode having the given shape on the electronic component.

2. Apparatus as in claim 1, wherein said inlet is at a lower portion of said container such that a substantial portion of the electrode paste stored in said container is above said inlet and below said slit plate.

3. Apparatus as in claim 1, further comprising: a scraper configured and sized to remove excess electrode paste which has adhered to said slit plate, said scraper being adapted to be placed on said slit plate and to scrape in a direction along said slit plate.

4. Apparatus as in claim 3, wherein said scraper comprises a triangle pole having a triangular cross-section, and being of sufficient length to extend substantially across said slit plate and transverse to said through slit.

5. Apparatus as in claim 4, wherein said scraper is disposed adjacent to a major surface of said slit plate which is away from said reservoir for storing electrode paste.

6. Apparatus as in claim 1, wherein an upper surface of said slit plate has an elastic sheet adhered thereto, thereby improving contact of said slit plate and an electronic component.

7. An apparatus for forming an electrode on an electronic component, comprising:

container means having an upper opening for providing a reservoir for storing electrode paste for forming an electrode, having a given shape, on an electronic component;

slit plate means provided with a through slit, said through slit having a shape corresponding to the given shape of the electrode to be formed, and means for arranging said slit plate means so as to cover said upper opening of said container means and thereby to enclose electrode paste;

means for supplying electrode paste to said container means through an inlet at a portion of said container means away from said upper opening; and means for causing the pressure in the interior of said container means to be higher than the pressure outside said container means, thereby causing electrode paste to rise up into and through said through slit, and thereby out of said container means, causing electrode paste to be formed into an extruded paste body corresponding in shape to the given shape of the electrode to be formed; and means for arranging an electronic component above said slit plate means and extending across said through slit, thereby causing said extruded paste body to form an electrode having the given shape on the electronic component.

8. Apparatus as in claim 7, wherein said inlet is at a lower portion of said container means such that a substantial portion of said electrode paste stored in said container means is above said inlet and below said slit plate means.

9. Apparatus as in claim 7, wherein an upper surface of said slit plate means has an elastic sheet adhered thereto, so as to improve contact of said slit plate means with an electronic component.

10. An apparatus for forming an electrode having a given shape on an electronic component, comprising:

first means for providing a reservoir for storing electrode paste, said first means having an upper opening;

second means for providing a through slit, said through slit having a shape corresponding to the given shape of an electrode to be formed, said second means being arranged to substantially cover said upper opening of said first means;

third means for causing electrode paste stored in said first means to rise up through said through slit of said second means, thereby causing electrode paste to form into an extruded paste body corresponding in shape to the shape of the electrode to be formed; and fourth means for arranging an electronic component adjacent to said second means and extending across said through slit, thereby causing said extruded paste body to form an electrode having the given shape on the electronic component.

11. Apparatus as in claim 10, further comprising: scraping means for removing excess electrode paste which has adhered to said second means, said scraping means being adapted to be placed upon said second means, and to scrape in a direction along said second means.

12. Apparatus as in claim 11, wherein said scraper means comprises a triangle pole having a triangular cross section, and being of sufficient length to extend substantially across said second means and transverse to said through slit.

13. Apparatus as in claim 10, wherein a major surface of said second means away from said first means has an elastic sheet adhered thereto, thereby improving contact of said second means and an electronic component.

* * * * *